(12) United States Patent
Han

(10) Patent No.: US 8,936,956 B2
(45) Date of Patent: Jan. 20, 2015

(54) SUBSTRATE MOVING UNIT FOR DEPOSITION, DEPOSITION APPARATUS INCLUDING THE SAME, METHOD OF MANUFACTURING ORGANIC LIGHT-EMITTING DISPLAY APPARATUS BY USING THE DEPOSITION APPARATUS, AND ORGANIC LIGHT-EMITTING DISPLAY APPARATUS MANUFACTURED BY USING THE METHOD

(71) Applicant: Samsung Display Co., Ltd., Yongin, Gyeonggi-Do (KR)

(72) Inventor: Jeong-Won Han, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/099,540

(22) Filed: Dec. 6, 2013

(65) Prior Publication Data

US 2014/0349428 A1 Nov. 27, 2014

(30) Foreign Application Priority Data

May 27, 2013 (KR) .......................... 10-2013-0059930

(51) Int. Cl.
 *H01L 21/00* (2006.01)
 *H01L 51/56* (2006.01)
(52) U.S. Cl.
 CPC ....................................... *H01L 51/56* (2013.01)
 USPC ............................... 438/28; 118/731; 118/729

(58) Field of Classification Search
 CPC ................... H01L 21/67184; H01L 21/67011; H01L 27/3258
 USPC .......... 118/731, 729; 438/28; 437/74; 349/47
 See application file for complete search history.

(56) References Cited

U.S. PATENT DOCUMENTS

| | | | |
|---|---|---|---|
| 2004/0142108 | A1 | 7/2004 | Atobe et al. |
| 2009/0291610 | A1* | 11/2009 | Sasaki .............................. 445/24 |
| 2011/0052791 | A1 | 3/2011 | Jo et al. |
| 2013/0109189 | A1* | 5/2013 | Cho et al. ...................... 438/710 |

FOREIGN PATENT DOCUMENTS

| | | |
|---|---|---|
| KR | 10-2004-0050045 | 6/2004 |
| KR | 10-2005-0033962 | 4/2005 |
| KR | 10-2009-0060835 | 6/2009 |
| KR | 10-20100117438 | 11/2010 |
| KR | 10-1174877 | 8/2012 |

* cited by examiner

*Primary Examiner* — Caridad Everhart
(74) *Attorney, Agent, or Firm* — Innovation Counsel LLP

(57) ABSTRACT

Provided are a substrate moving unit for use with a deposition apparatus that allows a deposition material to be precisely deposited on a target site of a substrate. The substrate moving unit includes an electrostatic chuck having a first surface on which a substrate is fixable and a magnetic force applying unit disposed on a second surface of the electrostatic chuck. A deposition apparatus including the substrate moving unit, a method of manufacturing an organic light-emitting display apparatus, and an organic light-emitting display apparatus manufactured by using the method are also presented.

6 Claims, 9 Drawing Sheets

SUBSTRATE MOVING UNIT FOR DEPOSITION, DEPOSITION APPARATUS INCLUDING THE SAME, METHOD OF MANUFACTURING ORGANIC LIGHT-EMITTING DISPLAY APPARATUS BY USING THE DEPOSITION APPARATUS, AND ORGANIC LIGHT-EMITTING DISPLAY APPARATUS MANUFACTURED BY USING THE METHOD

CROSS-REFERENCE TO RELATED APPLICATIONS

This application claims the benefit of Korean Patent Application No. 10-2013-0059930 filed on May 27, 2013 in the Korean Intellectual Property Office, the disclosure of which is incorporated herein in its entirety by reference.

BACKGROUND

1. Field

The present inventive concept relates to a substrate moving unit, and in particular, to a substrate moving unit for deposition that allows a deposition material to be accurately deposited on a substrate.

2. Description of the Related Art

Among display apparatuses, organic light-emitting display devices are drawing much attention as the next-generation mainstream display. This is due to various advantages they offer, such as wider viewing angles, better contrast characteristics, and faster response speeds than many other display devices.

An organic light-emitting display device includes an intermediate layer including an emission layer disposed between a first electrode and a second electrode. The first electrode, the second electrode, and the intermediate layer may be formed by using various methods, one of which is an independent deposition method. When an organic light-emitting display apparatus is manufactured by using the deposition method, a fine metal mask (FMM) having a pattern that is identical or similar to that of, for example, an intermediate layer is disposed to be close to a substrate on which the intermediate layer is to be formed, and a material for the intermediate layer is deposited thereon to form the intermediate layer having a predetermined pattern.

However, a deposition method according to the related art using the FMM presents difficulties with preparation of large organic light-emitting display apparatuses. A large FMM is used when large organic light-emitting display apparatuses are manufactured by using a large mother glass. A large FMM may also be used when a plurality of organic light-emitting display apparatuses are simultaneously manufactured by using a large mother substrate. During the manufacturing process involving a large FMM, the FMM may bend due to its own weight, making it difficult to form an intermediate layer having a predetermined fine pattern. Moreover, aligning a large substrate and a large FMM close to each other, performing deposition thereon, and separating the FMM from the substrate are time-consuming, resulting in a long manufacturing time and low production efficiency.

SUMMARY

A substrate moving unit for use with a deposition apparatus that allows a deposition material to be accurately deposited on a target site on a substrate, a deposition apparatus including the substrate moving unit, a method of manufacturing an organic light-emitting display apparatus, and an organic light-emitting display apparatus manufactured by using the method are presented.

Additional aspects will be set forth in part in the description which follows and, in part, will be apparent from the description, or may be learned by practice of the presented embodiments.

According to an aspect of the present invention, a substrate moving unit for use with a deposition apparatus includes: an electrostatic chuck configured to fix a substrate on a first surface; and a magnetic force applying unit disposed on a second surface of the electrostatic chuck.

The first surface of the electrostatic chuck may have a substrate mounting surface and a first buffer surface located to a side of the substrate mounting surface, and the magnetic force applying unit covers at least the substrate mounting surface and the first buffer surface.

The first surface of the electrostatic chuck may further have a margin surface located across the substrate mounting surface from the first buffer surface, wherein the first buffer surface is larger than the margin surface.

The substrate moving unit may further include a first dummy substrate disposed on the first buffer surface.

The first surface of the electrostatic chuck may further have a second buffer surface located across the substrate mounting surface from the first buffer surface, and the magnetic force applying unit further covers the second buffer surface. In this regard, the substrate moving unit may further include: a second dummy substrate disposed on the second buffer surface.

According to another aspect of the present invention, a deposition apparatus includes: a moving unit including: an electrostatic chuck configured to detachably fix a substrate on a first surface, and a magnetic force applying unit disposed on a second surface of the electrostatic chuck; a conveying unit including: a first conveying unit configured to convey the moving unit in a first direction, and a second conveying unit configured to convey the moving unit in a second direction opposite to the first direction, wherein the first conveying unit and the second conveying unit move the moving unit in a loop; and a deposition unit including at least one deposition assembly configured to deposit a material on the substrate while being spaced apart from the substrate and while the first conveying unit conveys the substrate fixed on the moving unit, wherein the deposition assembly includes: a deposition source configured to hold a deposition material; a deposition source nozzle that is configured to eject the deposition material toward the first conveying unit from the deposition source and that includes deposition source nozzle; and a patterning slit sheet between the deposition source nozzle and the moving unit, the patterning slit sheet including a plurality of patterning slits.

The magnetic force applying unit applies a magnetic force to the patterning slit sheet to prevent the patterning slit sheet from bending away from the first conveying unit.

The first surface of the electrostatic chuck has a substrate mounting surface on which the substrate is to be mounted and a first buffer surface located to a side of the substrate mounting surface, wherein the magnetic force applying unit corresponds to at least the substrate mounting surface and the first buffer surface, and the moving unit on which the substrate is fixed is conveyed by the first conveying unit to approach the patterning slit sheet of the deposition assembly such that the first buffer surface approaches the patterning slit sheet before the substrate mounting surface approaches the patterning slit sheet.

The first surface of the electrostatic chuck further has a margin surface located on the other side of the substrate mounting surface such that the substrate mounting surface approaches the patterning slit sheet before the margin surface approaches the patterning slit sheet while the moving unit is transported by the first conveying unit, wherein the first buffer surface is larger than the margin surface.

The deposition apparatus may further include a first dummy substrate disposed on the first buffer surface.

The first surface of the electrostatic chuck may further have a second buffer surface located across the substrate mounting surface from the first buffer surface such that the substrate mounting surface approaches the patterning slit sheet before the second buffer surface approaches the patterning slit sheet while the moving unit approaches the patterning slit sheet Furthermore, the deposition apparatus may further include: a second dummy substrate disposed on the second buffer surface.

According to another aspect of the present invention, a method of manufacturing an organic light-emitting display apparatus includes: conveying a moving unit into a chamber by using a first conveying unit while a substrate is fixed on a first surface of an electrostatic chuck of the moving unit; forming a layer by depositing a deposition material ejected from a deposition assembly on the substrate while the substrate is spaced apart from the deposition assembly in the chamber and being moved with respect to the deposition assembly by the first conveying unit; and returning the moving unit separated from the substrate by using a second conveying unit, wherein the deposition assembly includes: a deposition source configured to hold a deposition material; a deposition source nozzle that is configured to eject the deposition material toward the first conveying unit from the deposition source; and a patterning slit sheet between the deposition source nozzle and the moving unit, the patterning slit sheet including a plurality of patterning slits, and wherein the forming of a layer comprises using a magnetic force applying unit to apply a magnetic force-induced attractive force to the patterning slit sheet to prevent the patterning slit sheet from bending away from the first conveying unit, wherein the magnetic force applying unit is disposed across the electrostatic chuck from the first surface.

The first surface of the electrostatic chuck may have a substrate mounting surface on which the substrate is to be mounted and a first buffer surface located to a side of the substrate mounting surface, and the magnetic force applying unit covers at least the substrate mounting surface and the first buffer surface, wherein the forming of a layer comprises transporting the substrate with respect to the deposition assembly by using the first conveying unit in such a way that the first buffer surface of the surface of the electrostatic chuck approaches the patterning slit sheet before the substrate mounting surface approaches the patterning slit sheet.

The first surface of the electrostatic chuck may further have a margin surface located across the substrate mounting surface from the first buffer surface such that the substrate mounting surface approaches the patterning slit sheet and then, the margin surface approaches the patterning slit sheet while the moving unit, on which the substrate is fixed, approaches the patterning slit sheet of the deposition assembly by the first conveying unit.

The moving unit may further include a first dummy substrate disposed on the first buffer surface of the electrostatic chuck, and in the forming of the layer, when the first buffer surface is disposed above the patterning slit sheet of the deposition assembly, the magnetic force applying unit disposed on the other surface corresponding to the surface of the electrostatic chuck of the moving unit applies an attractive force due to a magnetic force to the patterning slit sheet through the first dummy substrate.

The first surface of the electrostatic chuck of the moving unit has a second buffer surface disposed across the substrate mounting surface from the first buffer surface, and the magnetic force applying unit covers at least the second buffer surface, wherein in the forming of the layer, the substrate is conveyed relatively to the deposition assembly by using the first conveying unit such that the substrate mounting surface approaches the patterning slit sheet before the second buffer surface approaches the patterning slit sheet. In this regard, the moving unit may further include a second dummy substrate disposed on the second buffer surface of the electrostatic chuck of the moving unit.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
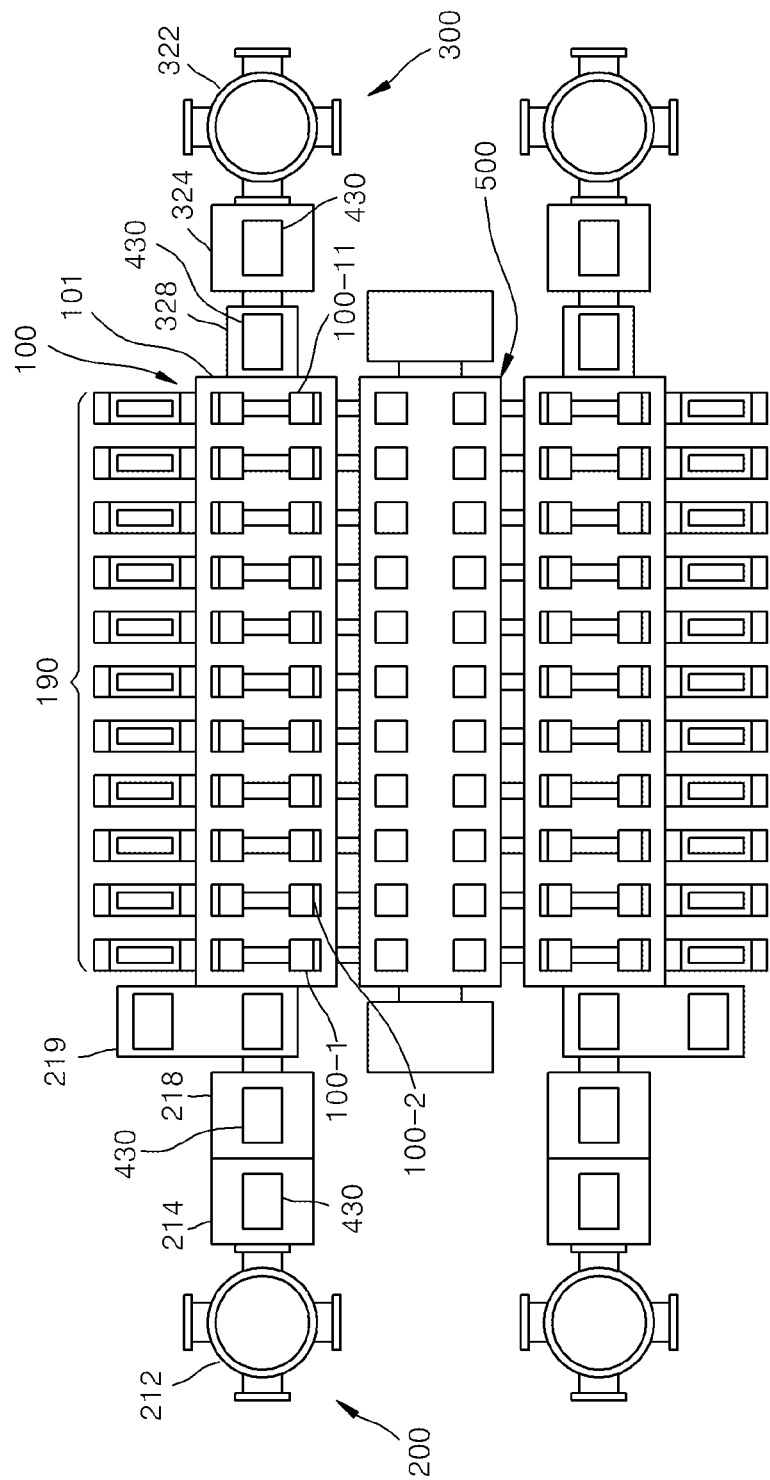
FIG. 1 is a conceptual plan view schematically illustrating a deposition apparatus according to an embodiment of the present invention.

Hereinafter, embodiments of the present invention will be described in detail with reference to accompanying drawings. However, the present invention is not limited to the embodiments. These embodiments are provided so that this disclosure will be thorough and complete, and will fully convey the concept of the invention to those skilled in the art. Also, for convenience of description, the size of constituting elements in the drawings may be exaggerated. For example, the size of constituting elements in the drawings is only an example for convenience of description. Accordingly, the present invention is not limited thereto.

In the following embodiments, the x axis, the y axis, and the z axis are not limited to three axes on a perpendicular coordinate, and may be interpreted broadly as a general concept including the axes. For example, the x axis, the y axis, and the z axis may be perpendicular to each other in some examples, and in other examples, the x axis, the y axis, and the z axis may indicate different directions that are not perpendicular to each other.

Also, in the following description, when a constituent element, such as a layer, a film, a region, or a plate, is described to exist on another constituent element, the constituent element may exist directly on the other constituent element or another constituent element may be interposed therebetween.

As used herein, the term "and/or" includes any and all combinations of one or more of the associated listed items. Expressions such as "at least one of," when preceding a list of elements, modify the entire list of elements and do not modify the individual elements of the list.

A method and apparatus for depositing layers on a large substrate are presented. Today, achieving precise deposition on a large substrate faces challenges stemming from the use of a large fine metal mask, which may bend and cause deposition errors. The apparatus disclosed herein provides an electrostatic chuck having a first surface on which a substrate can be fixed and a second surface that receives a magnetic force. A patterning slit sheet is positioned near the first surface of the electrostatic chuck, in a way that it would not come in direct contact with the substrate when the substrate is fixed on the chuck. Deposition material is supplied to the patterning slit sheet such that it flows through the slits and reaches the substrate.

The electric chuck is configured to move with respect to the patterning slit sheet. The deposition material is thus deposited on the substrate while the substrate is moving, allowing the entire substrate surface to be accessible for deposition using a patterning slit sheet that is smaller than the substrate size. To prevent the magnetic force from vibrating the patterning slit sheet and compromising the accuracy of the deposition, a buffer area may be formed on the electric chuck to stabilize the vibration. Various aspects of the apparatus and method are described in more detail below.

Figure 2:
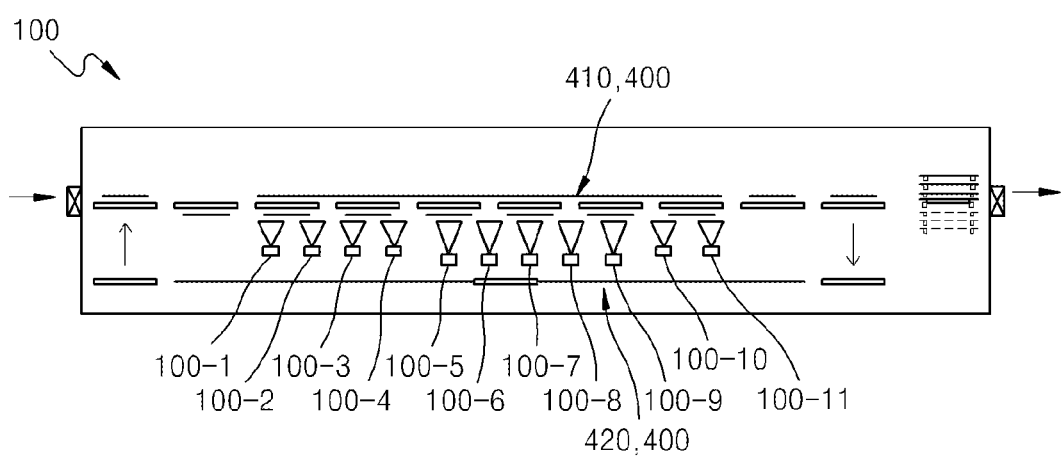
FIG. 2 is a side conceptual view schematically illustrating a deposition unit of the deposition apparatus of FIG. 1.

FIG. 1 is a conceptual plan view schematically illustrating a deposition apparatus according to an embodiment of the present invention. FIG. 2 is a side conceptual view schematically illustrating a deposition unit 100 of the deposition apparatus of FIG. 1.

Referring to FIGS. 1 and 2, the deposition apparatus according to an embodiment of the present invention includes the deposition unit 100, a loading unit 200, an unloading unit 300, a conveying unit 400, and a patterning slit sheet replacement unit 500. The conveying unit 400 may include a first conveying unit 410 that may convey in a first direction a moving unit 430 on which a substrate (2, see FIG. 3) is detachably fixed and a second conveying unit 420 that may convey the moving unit 430 separated from the substrate 2 in a direction opposite to the first direction.

The loading unit 200 may include a first rack 212, a transport chamber 214, a first inversion chamber 218, and a buffer chamber 219.

A plurality of substrates, on which deposition is to be performed, are stacked on the first rack 212. A transport mechanism holds up a substrate from the first rack 212 and mounts the substrate on the moving unit 430 which has been conveyed by the second conveying unit 420 and located inside the transport chamber 214. The substrate may be fixed on the moving unit 430 by using a clamp, and the moving unit 430, on which the substrate is fixed, is moved toward the first inversion chamber 218. Before the substrate 2 is fixed on the moving unit 430, if needed, the substrate 2 may be aligned with respect to the moving unit 430.

In first inversion chamber 218 located adjacent to the transport chamber 214, a first inversion mechanism inverses the moving unit 430. That is, the transport mechanism mounts the substrates 2 on a top surface of the moving unit 430, and while a surface of the substrate 2 opposite to a surface thereof facing the moving unit 430 faces upwards, the moving unit 430 is conveyed toward the first inversion chamber 218, and when the first inversion mechanism inverses the first inversion chamber 218, the surface of the substrate 2 opposite to the surface thereof facing the moving unit 430 faces downwards. In this state, the first conveying unit 410 conveys the moving unit 430 on which the substrate is fixed.

The unloading unit 300 proceeds in the reverse direction to that of the loading unit 200. That is, the substrate and the moving unit 430 that have passed the deposition unit 100 are inversed (e.g., turned upside down) in a second inversion chamber 328 by using a second inversion mechanism and then conveyed toward ejection release chamber 324. In the release chamber 324, the substrate is separated from the moving unit 430. The substrate (e.g., the substrate from which the moving unit 430 is separated) is mounted on the second rack 322. The second conveying unit 420 conveys the moving unit 430 separated from the substrate to return to the loading unit 200.

Embodiments of the present invention are not limited to what is described above. For example, originally, the substrate may be fixed on a bottom surface of the moving unit 430 and may be conveyed in this state. In this case, for example, the first inversion mechanism of the first inversion chamber 218 and the second inversion mechanism of the second inversion chamber 328 may not be used. Also, both the first inversion mechanism of the first inversion chamber 218 and the second inversion mechanism of the second inversion chamber 328 may inverse (turn the subject upside down), instead of just one of the first inversion chamber 218 and the second inversion chamber 328 (whichever one holds the moving unit 430 on which the substrate is fixed). In this case, while the moving unit 430 is located on the conveying unit, which may convey the moving unit 430 supporting the substrate, inside the first inversion chamber 218, the conveying unit 420 inside the first inversion chamber 218 may rotate at an angle of 180 degrees. When this rotation happens, the conveying unit 420 inside the first inversion chamber 218 may act as the first inversion mechanism or the second inversion mechanism. In this regard, the conveying unit 420 inside the first inversion chamber 218 may be a portion of the first conveying unit or a portion of the second conveying unit.

The deposition unit 100 may include, as illustrated in FIGS. 1 and 2, a chamber 101, and the chamber 101 may contain a plurality of deposition assemblies 100-1, 100-2, . . . , and 100-11. In FIG. 2, a first deposition assembly 100-1 through an eleventh deposition assembly 100-11 are disposed in the chamber 101. However, the number of deposition assemblies may vary according to a deposition material and a deposition condition. During deposition, the chamber 101 may be maintained in a vacuum state or a state that is similar to vacuum state.

The first conveying unit 410 may convey the moving unit 430 on which the substrate is fixed toward at least the deposition unit 100, and for example, may sequentially move from the loading unit 200 to the deposition unit 100, and to the unloading unit 300. The second conveying unit 420 returns the moving unit 430, which is separated from the substrate in the unloading unit 300, to the loading unit 200. By doing so, the moving unit 430 may circulate due to the first conveying unit 410 and the second conveying unit 420.

The first conveying unit 410 may be disposed in such a manner that when the first conveying unit 410 passes through the deposition unit 100, the first conveying unit 410 passes through the chamber 101. The second conveying unit 420 may be configured to convey the moving unit 430 from which the substrate is separated.

In this regard, the first conveying unit 410 and the second conveying unit 420 may be positioned to face each other. Due to this configuration, the moving unit 430 supporting the substrate on which deposition is performed while passing through the first conveying unit 410 is separated from the substrate in the unloading unit 300, and then returned to the loading unit 200 by the second conveying unit 420 disposed under the first conveying unit 410. Thus, space is utilized efficiently. In some embodiments, the second conveying unit 420 may be disposed above the first conveying unit 410.

Also, as illustrated in FIG. 1, the deposition unit 100 may include a deposition source replacement unit 190 disposed on a side of each of the first through eleventh deposition assemblies 100-1 to 100-11. Although not illustrated in detail, the deposition source replacement unit 190 may be formed in a cassette form, such that they can be removable from each of the first through eleventh deposition assemblies 100-1 to 100-11. By doing so, a deposition source (110 of FIG. 3) of the deposition assembly 100-1 is easily replaced with a new deposition source.

In FIG. 1, two deposition apparatuses each including the loading unit 200, the deposition unit 100, the unloading unit 300, and the conveying unit 400 are arranged in parallel to each other. In this case, a patterning slit sheet replacement unit 500 may be disposed between the two deposition apparatuses. That is, since two deposition apparatuses may share the patterning slit sheet replacement unit 500, thus improving space utilization efficiency compared to a case in which each of the deposition apparatuses includes its own patterning slit sheet replacement unit 500.

Figure 3:
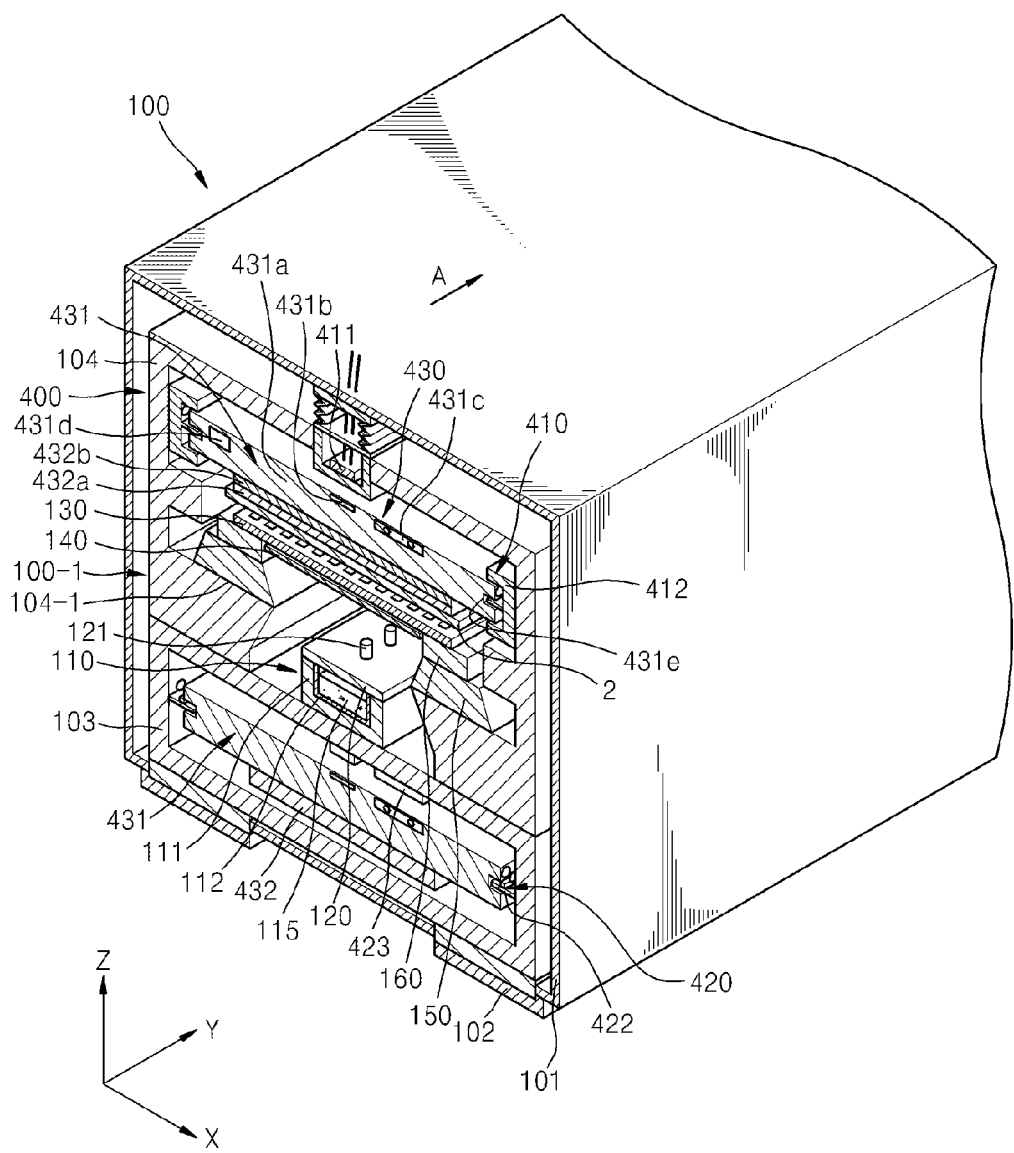
FIG. 3 is a perspective cross-sectional view schematically illustrating a portion of a deposition unit of the deposition apparatus of FIG. 1.
Figure 4:
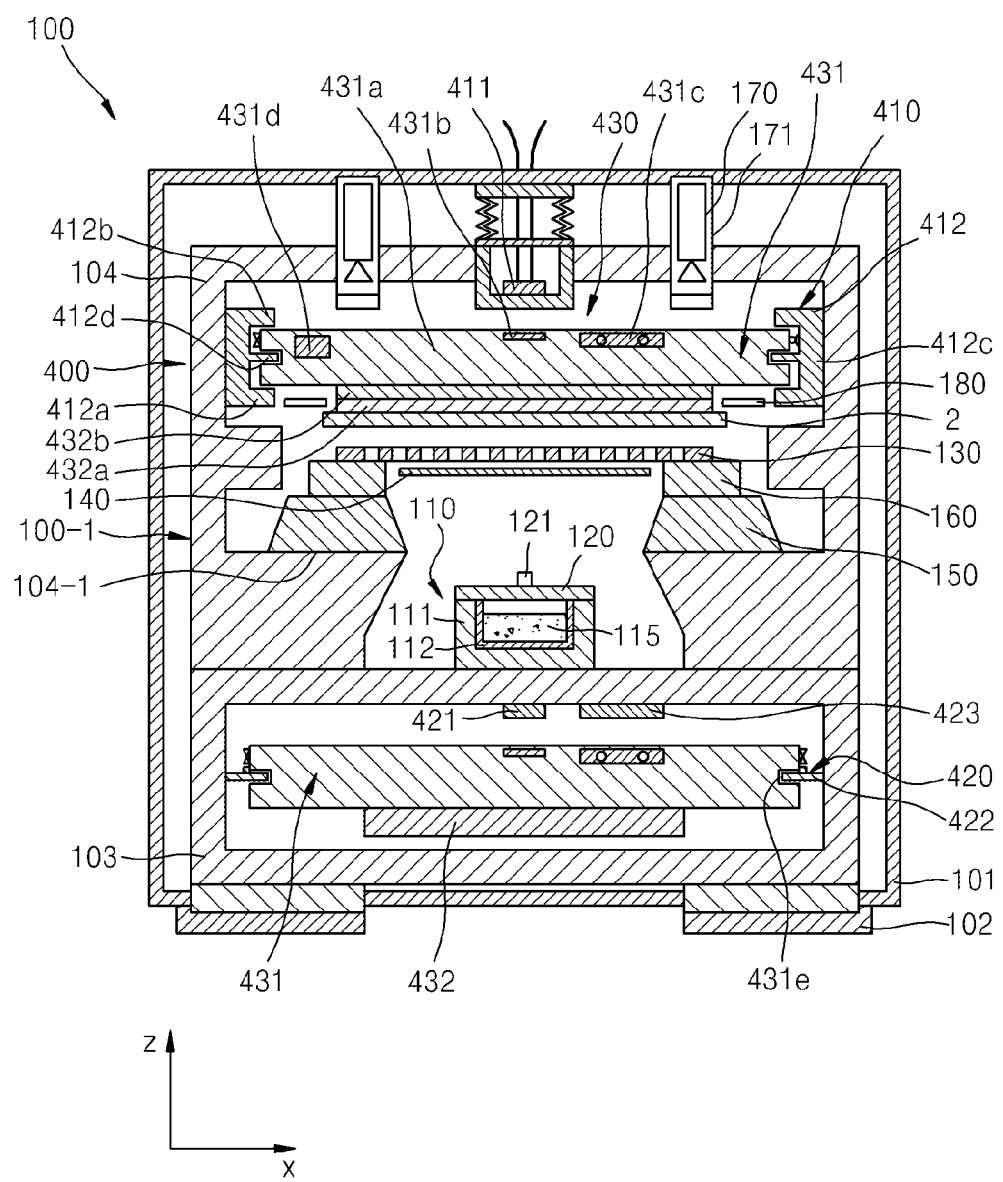
FIG. 4 is a cross-sectional view schematically illustrating a portion of a deposition unit of the deposition apparatus of FIG. 1.

FIG. 3 is a perspective cross-sectional view schematically illustrating a portion of the deposition unit 100 of the deposition apparatus of FIG. 1. FIG. 4 is a cross-sectional view schematically illustrating a portion of the deposition unit 100 of the deposition apparatus of FIG. 1. Referring to FIGS. 3 and 4, the deposition unit 100 of a deposition apparatus according to an embodiment of the present inventive concept includes a chamber 101 and at least one deposition assembly 100-1.

The chamber 101 may have an empty box shape, and may house at least one deposition assembly 100-1 therein. As illustrated, the conveying unit 400 may also be housed in the chamber 101, and in some cases, may extend outside the chamber 101.

The chamber 101 may house a bottom housing 103 and a top housing 104. In detail, the bottom housing 103 is disposed on a foot 102 that is fixable to a ground, and the top housing 104 may be disposed on the bottom housing 103. A connection portion of the bottom housing 103 and the chamber 101 may be encapsulated to block the inside of the chamber 101 from the outside. Since the bottom housing 103 and the top housing 104 are disposed on the foot 102 fixed on the ground, even when the chamber 101 repeatedly shrinks and/or expands, the locations of the bottom housing 103 and the top housing 104 may be fixed. Accordingly, the bottom housing 103 and the top housing 104 may act as a reference frame within the deposition unit 100.

The top housing 104 may house the deposition assembly 100-1 and the first conveying unit 410 of the conveying unit 400, and the bottom housing 103 may house the second conveying unit 420 of the conveying unit 400. While the moving unit 430 is transported by the first conveying unit 410 and the second conveying unit 420, deposition may be repeatedly performed on the substrate fixed on the moving unit 430. The moving unit 430 may include an electrostatic chuck 432a on which a substrate is fixable and a magnetic force applying unit 432b that is disposed on a surface of the electrostatic chuck 432a opposite to the substrate. In other embodiments, as illustrated, the moving unit 430 may further include a carrier 431 that is directly or indirectly connected to the electrostatic chuck 432a or the magnetic force applying unit 432b.

The carrier 431 may include a main body 431a, a linear motor system (LMS) magnet 431b, a contactless power supply (CPS) module 431c, a power unit 431d, and a guide groove 431e. However, according to purpose, the carrier 431 may further include a cam follower.

The main body 431a may constitute a substrate of the carrier 431, and may be formed of a magnetic material, such as iron. The main body 431a of the carrier 431 may allow the carrier 431 to be spaced apart from the guide unit 412 of the first conveying unit 410 due to an attractive force or a repulsive force with magnetic levitation bearings (not shown). A guide groove 431e may be formed on both sides of the main body 431a. The guide groove 431e may house either a guide protrusion 412d of the guide unit 412 of the first conveying unit 410 or a roller guide 422 of the second conveying unit 420.

Furthermore, the main body 431a may include a magnetic rail 431b disposed along a central line of a progressing direction (Y axis direction). The magnetic rail 431b of the main body 431a may constitute a linear motor together with a coil 411 of the first conveying unit 410, and due to the linear motor, the carrier 431, that is, the moving unit 430 may be conveyed in a "direction A." Accordingly, even without supply of power, the moving unit 430 may be conveyed when a current is applied to the coil 411 of the first conveying unit 410. To do this, a plurality of the coils 411 may be arranged at constant intervals in the chamber 101 in the Y direction. Since the coil 411 is disposed in an atmosphere box, the coil 411 may be installed in an atmospheric condition.

The main body 431a may include a CPS module 431c disposed on a side of the magnetic rail 431b and a power unit 431d disposed on the other side of the magnetic rail 431b. The power unit 431d may include a chargeable battery for supplying power to allow the electrostatic chuck 432a to chuck the substrate and maintain the chucked substrate, and the CPS module 431c is a wireless charging module for charging the chargeable battery of the power unit 431d. The second conveying unit 420 includes a charging track 423, which is connected to an inverter (not shown) and thus, when the second conveying unit 420 coveys the carrier 431, a magnetic force is generated between the charging track 423 and the CPS module 431c and thus, power is supplied to the CPS module 431c, and thus, the power unit 431d is charged.

The electrostatic chuck 432a may include a main body formed of ceramic and electrodes which are embedded in the main body and to which power is applied. The electrostatic chuck 432a may allow the substrate 2 to be attached to the surface of its main body, when high voltage is applied to the electrodes embedded in the main body from the power unit 431d of the main body 431a of the carrier 431.

The magnetic force applying unit 432b may include a permanent magnet or an electric magnet, and may apply a magnetic force to a patterning slit sheet 130 disposed under the substrate 2 through the electrostatic chuck 432a and the substrate 2 fixed on the electrostatic chuck 432a. The magnetic force applying unit 432b may prevent the patterning slit sheet 130 from bending downwards (−Z direction).

The first conveying unit 410 may convey the moving unit 430 on which the substrate is fixed in the first direction (+Y direction). The first conveying unit 410 includes the coil 411 and the guide unit 412, and may further include magnetic levitation bearings and a gap sensor.

The coil 411 and the guide unit 412 may be disposed on an inner surface of the top housing 104. For example, the coil 411 may be disposed on a top inner surface of the top housing 104, and the guide unit 412 may be disposed on side inner surfaces of the top housing 104.

The coil 411 may constitute, as described above, a linear motor together with the magnetic rail 431b of the main body 431a of the moving unit 430 to allow the moving unit 430 to move. The guide unit 412 may guide the moving unit 430 in such a manner that when the moving unit 430 moves, the moving unit 430 is conveyed in the first direction (Y axis direction). The guide unit 412 may be disposed to pass through the deposition unit 100.

In detail, the guide unit 412 may house both sides of the carrier 431 of the moving unit 430 to guide the carrier 431 to move in the direction A (shown by an arrow) of FIG. 3. To do this, the guide unit 412 includes a first accommodation part 412a disposed under the carrier 431, a second accommodation part 412b disposed above the carrier 431, and a connection portion 412c connecting the first accommodation part 412a to the second accommodation part 412b. The first accommodation part 412a, the second accommodation part 412b, and the connection portion 412c may form an accommodation groove, and the guide unit 412 may have a guide protrusion 412d in the accommodation groove.

Magnetic levitation bearings (not shown) may be disposed on the connection portion 412c of the guide unit 412 to correspond to both sides of the carrier 431. Due to the magnetic levitation bearings, the carrier 431 is spaced apart from the guide unit 412, and thus, when the carrier 431 is conveyed along the guide unit 412, the carrier 431 does not contact the guide unit 412. The magnetic levitation bearings may be further disposed on the second accommodation part 412b of the guide unit 412 to make them be disposed above the carrier 431, and in this case, the magnetic levitation bearings may allow the carrier 431 to move along the guide unit 412 at constant intervals while the carrier 431 does not contact the first accommodation part 412a or the second accommodation part 412b. To detect intervals between the carrier 431 and the guide unit 412, the guide unit 412 may include a gap sensor (not shown) disposed on the first accommodation part 412a and/or the connection portion 412c to correspond to a lower portion of the carrier 431. According to values measured by using the gap sensor, the magnetic force of the magnetic levitation bearings may be changed to adjust an interval between the carrier 431 and the guide unit 412 in real time. That is, due to the feedback control performed by using magnetic levitation bearings and the gap sensor, the carrier 431 may be finely conveyed.

The second conveying unit 420 may return to the loading unit 200 the moving unit 430 on which deposition is performed while passing the deposition unit 100 and from which the substrate 2 is separated in the unloading unit 300. The second conveying unit 420 may include a coil 421 and a roller guide 422, which are disposed in the bottom housing 103, and the charging track 423 described above. For example, the coil 421 and the charging track 423 may be disposed on a top inner surface of the bottom housing 103 and the roller guide 422 may be disposed on both side surfaces of the bottom housing 103. In this regard, although not illustrated, the coil 421 may be, like the coil 411 of the first conveying unit 410, disposed inside an atmospheric box.

The coil 421 may constitute, like the coil 411, a linear motor together with the magnetic rail 431b of the carrier 431 of the moving unit 430. Due to the linear motor, the moving unit 430 may be conveyed in an opposite direction (−Y direction) to the first direction (+Y direction).

The roller guide 422 may guide the carrier 431 to move in a second direction opposite of the first direction. The roller guide 422 may be disposed to pass through the deposition unit 100. The roller guide 422 supports a cam follower (not shown) disposed on both sides of the carrier 431 of the moving unit 430, and guides the moving unit 430 to be conveyed in the opposite direction (−Y direction) of the first direction (+Y direction).

The second conveying unit 420 returns the moving unit 430 separated from the substrate 2 towards the loading unit 200. Accordingly, compared to the first conveying unit 410 for conveying the moving unit 430 on which the substrate is fixed to perform deposition on the substrate 2, the moving unit 430 is required to relatively low position accuracy. Thus, a magnetic levitation function is provided to the first conveying unit 410, which is required to have high position accuracy for the moving unit 430 conveyed thereby, to make the moving unit 430 have a high position accuracy, and a roller method according to the related art is applied to the second conveying unit 420. By doing so, the structure of a deposition apparatus is simplified, and manufacturing costs for the deposition apparatus may reduce. In other embodiments, if needed, the magnetic levitation function may also be applied to the second conveying unit 420.

The deposition assembly 100-1 may, when the first conveying unit 410 conveys the substrate 2 fixed on the moving unit 430 in the first direction (+Y direction), deposit a material on the substrate 2 while the deposition assembly 100-1 is spaced apart from the substrate 2. Hereinafter, a detailed structure of the deposition assembly 100-1 will be described.

The deposition assembly 100-1 includes a deposition source 110, a deposition source nozzle unit 120, a patterning slit sheet 130, a shielding member 140, a first stage 150, a second stage 160, a camera 170, and a sensor 180. In this regard, most of the elements illustrated in FIGS. 3 and 4 may be arranged in the chamber 101 maintained in an appropriate vacuum state. This structure is needed to achieve the linearity of a deposition material.

The deposition source 110 may hold a deposition material. The deposition source 110 may be disposed in a lower portion of the top housing 104, and thus, when the deposition material 115 placed inside the deposition source 110 vaporizes/evaporates, the deposition material may flow in a direction toward the substrate 2 (for example, +Z direction) via deposition source nozzles 121. In detail, the deposition source 110 includes a crucible 111 to be filled with the deposition material 115, and a heater 112 that heats the crucible 111 to evaporate the deposition material 115 filled in the crucible 111.

The deposition source 110 includes a deposition source nozzle unit 120 with a deposition source nozzle 121 thereon configured to let the deposition material out toward the first conveying unit 410 (+Z direction). The deposition source nozzle unit 120 illustrated in FIG. 3 includes a plurality of the deposition source nozzles 121. In other embodiments, the deposition source nozzle unit 120 may have, instead of the protrusion shape-nozzles, holes or other outlets for use as a nozzle.

The patterning slit sheet 130 may be disposed to face the deposition source nozzle unit 120, and may have a plurality of patterning slits positioned in a row (e.g., X-axis direction). The patterning slit sheet 130 may be located between the deposition source 110 and the substrate 2. The deposition material 115 vaporized in the deposition source 110 may pass through the deposition source nozzle unit 120 and the patterning slit sheet 130 and may be deposited on the substrate 2, which is the target. In other embodiments, however, when a deposition layer is formed on the entire surface of the substrate 2, the patterning slit sheet 130 may have, instead of a plurality of patterning slits, an opening extending in the X-axis.

The patterning slit sheet 130 may be manufactured by etching used in manufacturing a conventional fine metal mask (FMM), for example, a stripe-type mask. The patterning slit sheet 130 may be spaced apart from the deposition source 110 and the deposition source nozzle unit 120 coupled to the deposition source 110.

To form a desired pattern on the substrate 2 by depositing the deposition material 115 ejected from the deposition source 110 through the deposition source nozzle unit 120 and the patterning slit sheet 130, the inside of a chamber (not shown) needs to have a high-vacuum state, which is identical or similar to that in the case of FMM deposition. Also, the temperature of the patterning slit sheet 130 may be sufficiently lower than the temperature of the deposition source 110 (about 100° C. or lower). Only when the temperature of the patterning slit sheet 130 is sufficiently low, thermal expansion of the patterning slit sheet 130 due to temperature may be minimized. That is, when the temperature of the patterning slit sheet 130 raises, due to the thermal expansion, the size or location of patterning slits of the patterning slit sheet 130 may change, and thus, the pattern formed on the substrate 2 may be different from a predetermined pattern.

The substrate 2, which is a target, may be disposed inside the chamber 101. The substrate 2 may be a substrate for a flat panel display apparatus, and may be a large substrate such as a mother glass for forming a plurality of flat panel display apparatuses.

As described above, when a conventional deposition method using a FMM is used, the area of the FMM needs to be same as the area of a substrate. Accordingly, an increase in the size of the substrate leads to a larger FMM, making it difficult to manufacture a FMM. Also, due to the weight of the FMM, the FMM may bend. Accordingly, an intermediate layer having a predetermined accurate pattern is not formed.

However, according to the deposition apparatus according to the present embodiment, deposition is performed while the deposition assembly 100-1 and the substrate 2 move relatively to each other. In detail, while the first conveying unit 410 conveys the substrate 2 fixed on the moving unit 430 in the first direction (+Y direction), the deposition assembly 100-1 spaced apart from the substrate 2 at a predetermined distance deposits a material on the substrate 2. In other words, while the substrate 2 disposed to face the deposition assembly 100-1 is conveyed in the arrow A direction of FIG. 3, deposition is performed by scanning. Although in the drawing, the substrate 2 is subjected to deposition while the substrate 2 moves in the +Y direction in the chamber 101, the present invention is not limited thereto. For example, in another embodiment, the location of the substrate 2 may be fixed and deposition is performed thereon while the deposition assembly 100-1 moves in the −Y direction.

Accordingly, in the case of the deposition apparatus according to the present embodiment, the size of the patterning slit sheet 130 may be much smaller than that of a conventional FMM. That is, in the case of the deposition apparatus according to the present embodiment, deposition is performed continuously in a scanning manner while the substrate 2 moves along the Y-axis. Accordingly, even when the length of the patterning slit sheet 130 in the Y-axis direction is much smaller than the length of the substrate 2 in the Y-axis direction, deposition may be sufficiently performed on almost the entire surface of the substrate 2.

As described above, since the size of the patterning slit sheet 130 may be much smaller than the size of a conventional FMM, the patterning slit sheet 130 may be manufactured very easily. That is, in processes for manufacturing the patterning slit sheet 130, including an etching process, a fine tensioning process, a welding process, a moving process, and a washing process, the patterning slit sheet 130 having a small size is much advantageous over processes associated with a large-area FMM. This advantage may be more appropriate for a larger display apparatus.

As described above, the deposition assembly 100-1 may, when the first conveying unit 410 conveys the substrate 2 fixed on the moving unit 430 in the first direction (+Y direction), deposit a material on the substrate 2 while the deposition assembly 100-1 is spaced apart from the substrate 2. This means that the patterning slit sheet 130 is spaced apart from the substrate 2 at a predetermined distance. In the case of a deposition apparatus using a FMM, the FMM contacts a substrate to cause defects. However, in the case of the deposition apparatus according to the present embodiment, such defects may be efficiently prevented. Also, since there is no required period during which a substrate and a mask remain in contact with each other, manufacturing speed may substantially increase.

The upper housing 104 may have an accommodation portion 104-1 that protrudes on both sides of the deposition source 110 and the deposition source nozzle unit 120, and the first stage 150 and the second stage 160 may be disposed on the accommodation portion 104-1, and the patterning slit sheet 130 may be disposed on the second stage 160.

The first stage 150 may control the location of the patterning slit sheet 130 in the X-axis direction and the Y-axis direction. That is, the first stage 150 may include a plurality of actuators to change the location of the patterning slit sheet 130 in the X-axis direction and the Y-axis direction with respect to the upper housing 104. The second stage 160 may control the location of the patterning slit sheet 130 in the Z-axis direction. For example, the second stage 160 includes actuators to change the location of the patterning slit sheet 130 in the Z-axis direction with respect to the first stage 150, that is, the upper housing 104.

As described above, the first stage 150 and the second stage 160 are used to control the location of the patterning slit sheet 130 with respect to the substrate 2 to align (e.g., in real-time) the substrate 2 and the patterning slit sheet 130.

Also, the upper housing 104, the first stage 150, and the second stage 160 may guide the deposition material in such a manner that the deposition material exiting through the position source nozzle 121 is not dispersed. That is, the upper housing 104, the first stage 150, and the second stage 160 may restrict the movement of the deposition material in the X-axis direction.

Also, the deposition assembly 100-1 may further include the camera 170 and the sensor 180 which are used for aligning. The sensor 180 may be a confocal sensor. The camera 170 may monitor (e.g., in real time) a first mark (not shown) formed on the patterning slit sheet 130 and a second mark (not shown) formed on the substrate 2 to produce data for aligning the patterning slit sheet 130 and the substrate 2 with accuracy on an XY plane, and the sensor 180 may produce data associated with separation distances between the patterning slit sheet 130 and the substrate 2 to separate the patterning slit sheet 130 from the substrate 2 by appropriate distances.

As described above, the camera 170 and the sensor 180 monitor distances between the substrate 2 and the patterning slit sheet 130, often in real time. Accordingly, the substrate 2 and the patterning slit sheet 130 are real-time aligned. Thus, a pattern with high location accuracy may be obtained.

Also, the shielding member 140 may be disposed between the patterning slit sheet 130 and the deposition source 110 to prevent a material from being deposited on a non-film formation area of the substrate 2. Although not illustrated in detail, the shielding member 140 may include two plates located adjacent to each other. Since the shielding member 140 shields the non-film formation area of the substrate 2, the deposition of a material on the non-film formation area of the substrate 2 may be effectively prevented even without use of a separate structure.

Also, as described above, the substrate 2 fixed on a first surface of the moving unit 430 may be conveyed by the first conveying unit 410 above the deposition assembly 100-1 in the first direction (+Y direction) while the substrate 2 is spaced apart from the deposition assembly 100-1 by a predetermined distance. That is, the substrate 2 fixed on the moving unit 430 is disposed adjacent to the patterning slit sheet 130 of the deposition assembly 100-1, and while not in contact with the patterning slit sheet 130, the substrate 2 may be conveyed by the first conveying unit 410 in the first direction (+Y direction). Accordingly, the central portion of the patterning slit sheet 130 may bend in the −Z direction due to the self gravity.

Unlike a conventional FMM, since the substrate 2 fixed on the moving unit 430 is conveyed by the first conveying unit 410 in the first direction (+Y direction) and deposition is performed continuously, that is, in a scanning manner, the length of the patterning slit sheet 130 in the first direction (+Y direction) may be much smaller than the Y-axis direction of the substrate 2. Accordingly, the area of the patterning slit sheet 130 is substantially smaller than that of a conventional FMM, and thus, compared to the conventional FMM, the degree of the weight-induced bending may not be high. However, since the length of the patterning slit sheet 130 in the second direction (X-axis direction) perpendicular to the first direction (+Y direction) corresponds to the length of the substrate 2 in the second direction (X-axis direction), when deposition is performed on a large-area substrate, the bending of the patterning slit sheet 130 due to the weight may be taken into consideration.

As described above, when the bending of the central portion of the patterning slit sheet 130 is taken into consideration, the deposition material ejected from the deposition source 110 through the patterning slit sheet 130 to the substrate 2 may not be accurately deposited on a predetermined location of the substrate 2.

However, in the case of the deposition apparatus according to the present embodiment, the moving unit 430 includes, in addition to the electrostatic chuck 432a having a surface on which the substrate 2 is fixable, the magnetic force applying unit 432b disposed on a second surface of the electrostatic chuck 432a. The first surface and the second surface of the electrostatic chuck 432a may be opposite surfaces, as in the embodiment of FIG. 4. The magnetic force applying unit 432b may apply a magnetic force to the patterning slit sheet 130 disposed under the electrostatic chuck 432a and the substrate 2 fixed on the electrostatic chuck 432a through the electrostatic chuck 432a and the substrate 2 fixed on the electrostatic chuck 432a. Accordingly, when the substrate 2 passes through the patterning slit sheet 130, due to the magnetic force of the magnetic force applying unit 432b, the patterning slit sheet 130 is pulled in a direction toward the substrate 2 (a direction toward the first conveying unit 410), so that the patterning slit sheet 130 maintains its non-contact state with the substrate 2 and the bending of the central portion of the patterning slit sheet 130 is prevented, leading to a substantial increase in accuracy of deposition. To do this, the patterning slit sheet 130 may include, for example, a material to which a magnetic force is applicable, such as metal.

Figure 5:
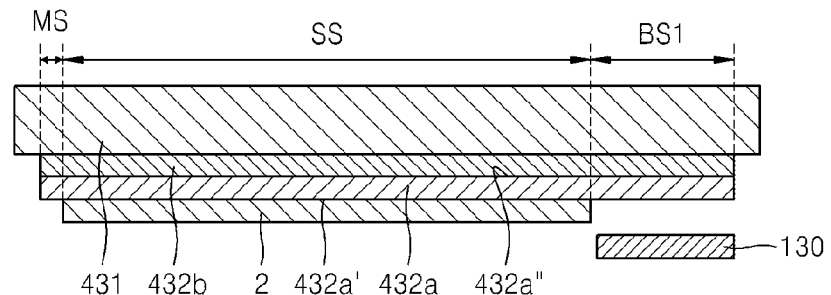
FIG. 5 is a side cross-sectional view schematically illustrating a portion of a deposition assembly in a moving unit and a deposition unit of a deposition apparatus according to another embodiment of the present invention.
Figure 5:
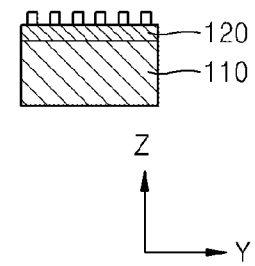

FIG. 5 is a side cross-sectional view schematically illustrating a portion of a deposition assembly in the moving unit 430 and the deposition unit 100 of a deposition apparatus according to another embodiment of the inventive concept. In the deposition apparatus according to the present embodiment, a surface 432a' of the electrostatic chuck 432a, on which the substrate 2 is fixed, has a substrate mounting surface SS on which the substrate 2 is mounted and a first buffer surface BS1 located next to (in the first direction (+Y direction)) the substrate mounting surface SS. In some embodiments, instead of the side of the substrate mounting surface SS, for example, a margin surface MS may be located on the other side of the substrate mounting surface SS in the opposite direction (that is, the opposite direction of the first direction (−Y direction)).

The margin surface MS may be an area that remains when the substrate 2 is fixed on the electrostatic chuck 432a. Accordingly, the margin surface MS may be understood as a conventionally referred margin space. Since the area of the first buffer surface BS1 is greater than the area of the margin surface MS, the first buffer surface BS1 may be understood as a planned buffer space, not the conventional margin space.

In this regard, the magnetic force applying unit 432b disposed on the other surface 432a" of the electrostatic chuck 432a may correspond to at least the substrate mounting surface SS and the first buffer surface BS1. In associated drawings, the magnetic force applying unit 432b has an area covered by the substrate mounting surface SS, the first buffer surface BS1, and the margin surface MS.

As described above, the substrate 2 is conveyed by the moving unit 430 including the electrostatic chuck 432a and the magnetic force applying unit 432b in the first direction (+Y direction). During the conveying, when the magnetic force applying unit 432b is located above the patterning slit sheet 130, due to the magnetic force of the magnetic force applying unit 432b, the patterning slit sheet 130 may not bend downward (−Z direction) and may be pulled upward (+Z direction). In this regard, when the magnetic force applying unit 432b begins to enter the space above the patterning slit sheet 130 and moves the patterning slit sheet 130 upward (+Z direction), the patterning slit sheet 130 may vibrate due to the movement of some of the patterning slit sheet 130. As described above, when the patterning slit sheet 130 vibrates, the deposition material, which is emitted from the deposition source 110 and disposed on the substrate 2 through the patterning slit sheet 130, may not be accurately deposited on a predetermined site.

However, in the case of the deposition apparatus according to the present embodiment, the surface of 432a' of the electrostatic chuck 432a, on which the substrate 2 is fixed, has the substrate mounting surface SS on which the substrate 2 is mounted and the first buffer surface BS1 located next to the substrate mounting surface SS in the first direction (+Y direction). The magnetic force applying unit 432b corresponds to the substrate mounting surface SS and the first buffer surface BS1.

Accordingly, when the substrate 2 is conveyed by the moving unit 430 including the electrostatic chuck 432a and the magnetic force applying unit 432b in the first direction (+Y direction), the first buffer surface BS1 approaches and passes above the patterning slit sheet 130 before the substrate mounting surface SS (on which the substrate 2 is mounted) passes above the patterning slit sheet 130. Accordingly, even when the patterning slit sheet 130 vibrates due to the application of a magnetic force by the magnetic force applying unit 432b, the vibration may be gradually reduced while the first buffer surface BS1 is passing above the patterning slit sheet 130. As a result, by the time the substrate mounting surface SS on which the substrate 2 is mounted passes above the patterning slit sheet 130, the vibration of the patterning slit sheet 130 might have ended or may be minimal. Accordingly, the deposition material may be deposited with enhanced accuracy on a predetermined site of the substrate 2.

As described above, although a magnetic force is applied to the patterning slit sheet 130, the first buffer surface BS1, on which the substrate 2 is not disposed, needs to be sufficiently large to remove or minimize the vibration of the patterning slit sheet 130. In this aspect, the area of the first buffer surface BS1 may correspond to at least the area of the patterning slit sheet 130. The margin surface MS, on the other hand, may be smaller.

When the magnetic force applying unit 432b applies a magnetic force to the patterning slit sheet 130 while being conveyed in the first direction +Y direction, initially, the magnetic force is applied to only a portion of the patterning slit sheet 130 (in the −Y direction). Thereafter, more area of the patterning slit sheet 130 is affected by the magnetic force, and eventually, the entire area of the patterning slit sheet 130 is affected by the magnetic force. The patterning slit sheet 130 vibrates when the magnetic force is applied to less than all of the patterning slit sheet 130. When the entire area of the patterning slit sheet 130 is affected by the magnetic force, the patterning slit sheet 130 may not vibrate or even when the vibration occurs, the vibration may not affect the accuracy of deposition. Accordingly, by controlling the area of the first buffer surface BS1 to correspond to at least the area of the patterning slit sheet 130, a decrease in the accuracy of deposition due to the vibration of the patterning slit sheet 130 may be effectively prevented.

Figure 6:
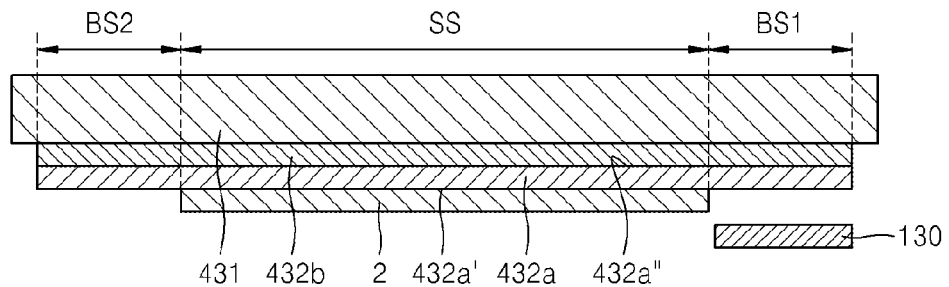
FIG. 6 is a side cross-sectional view schematically illustrating a portion of a deposition assembly in a moving unit and a deposition unit of a deposition apparatus according to another embodiment of the present invention.
Figure 6:
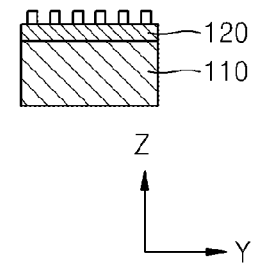

FIG. 6 is a side cross-sectional view schematically illustrating a portion of a deposition assembly in the moving unit 430 and the deposition unit 100 of a deposition apparatus according to another embodiment of the present inventive concept. The deposition apparatus according to the present embodiment is different from the deposition apparatus described in connection with FIG. 5. For example, the surface 432a' of the electrostatic chuck 432a includes, in addition to the first buffer surface BS1 located on the side (+Y direction) of the substrate mounting surface SS, a second buffer surface BS2 located on the other side (−Y direction) of the substrate mounting surface SS. The magnetic force applying unit 432b covers the second buffer surface BS2.

The substrate 2 is conveyed by the moving unit 430 including the electrostatic chuck 432a and the magnetic force applying unit 432b in the first direction (+Y direction). During the conveying, when the magnetic force applying unit 432b is located above the patterning slit sheet 130, due to the magnetic force of the magnetic force applying unit 432b, the patterning slit sheet 130 may not bend downward (−Z direction) and may be pulled upward (+Z direction). In this regard, when the magnetic force applying unit 432b begins to leave the space above the patterning slit sheet 130, the patterning slit sheet 130 may vibrate due to the movement of some of the patterning slit sheet 130. As described above, when the patterning slit sheet 130 vibrates, the deposition material that is emitted from the deposition source 110 and lands on the substrate 2 through the patterning slit sheet 130, may not be accurately deposited on a predetermined site.

However, in the case of the deposition apparatus according to the present embodiment, the surface of 432a' of the electrostatic chuck 432a on which the substrate 2 is fixed has the substrate mounting surface SS on which the substrate 2 is mounted and the second buffer surface BS2 located on the other side (first direction (+Y direction)) of the substrate mounting surface SS. The magnetic force applying unit 432b covers the second buffer surface BS2.

Accordingly, when the substrate 2 is conveyed by the moving unit 430 including the electrostatic chuck 432a and the magnetic force applying unit 432b in the first direction (+Y direction), and when the substrate mounting surface SS on which the substrate 2 is mounted leaves the space above the patterning slit sheet 130, the second buffer surface BS2 passes above the patterning slit sheet 130. Accordingly, even when the substrate mounting surface SS, with the substrate 2 on it, leaves the space above the patterning slit sheet 130, the magnetic force applying unit 432b may continuously apply a magnetic force to the patterning slit sheet 130. As a result, before the substrate mounting surface SS, on which the substrate 2 is mounted, completely leaves the space above the patterning slit sheet 130, any vibration of the patterning slit sheet 130 may have stopped. Accordingly, the deposition material may be accurately deposited without interference from the vibration on a predetermined site of the substrate 2.

As described above, although a magnetic force is applied to the patterning slit sheet 130, the second buffer surface BS2 has a minimum size to remove or minimize the vibration of the patterning slit sheet 130 until the substrate 2 leaves the space above the patterning slit sheet 130. In this aspect, the area of the second buffer surface BS2 may equal to at least the area of the patterning slit sheet 130.

That is, when the magnetic force applying unit 432b is conveyed in the first direction (+Y direction) and begins to leave the space above the patterning slit sheet 130, the magnetic force may stop being applied to a portion (−Y direction) of the patterning slit sheet 130, or the applied magnetic force may begin to get reduced. Thereafter, a more and more of the patterning slit sheet 130 is not affected by the magnetic force, and eventually, the entire patterning slit sheet 130 is not affected by the magnetic force. The patterning slit sheet 130 may vibrate only when the magnetic force is not applied to a portion of the patterning slit sheet 130 or the applied magnetic force is weak. Accordingly, when the substrate 2 is completely left above the patterning slit sheet 130, and the magnetic force stops to be applied to a portion of the patterning slit sheet 130 or the applied magnetic force becomes weak enough during the deposition of material on the substrate 2, the patterning slit sheet 130 may not vibrate. Further, even when the patterning slit sheet 130 vibrates, the vibration does not affect the accuracy of deposition. Accordingly, by making the second buffer surface BS2 to be at least as large as the patterning slit sheet 130, any negative effect on the accuracy of deposition due to the vibration of the patterning slit sheet 130 may be effectively reduced or prevented.

Figure 7:
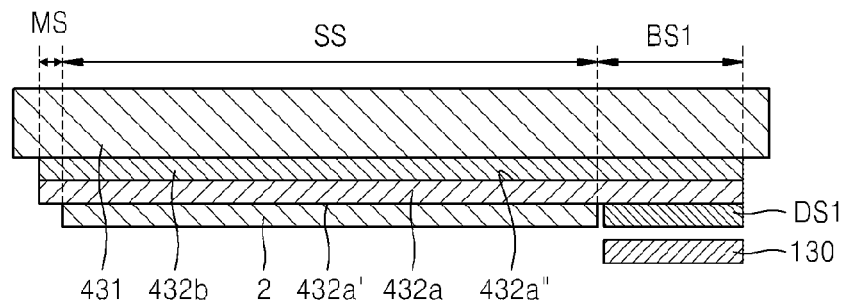
FIG. 7 is a side cross-sectional view schematically illustrating a portion of a deposition assembly in a moving unit and a deposition unit of a deposition apparatus according to another embodiment of the present invention.
Figure 7:
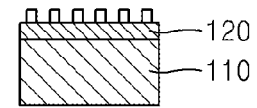

FIG. 7 is a side cross-sectional view schematically illustrating a portion of a deposition assembly in the moving unit 430 and the deposition unit 100 of a deposition apparatus according to another embodiment of the present invention. The deposition apparatus according to the present embodiment is different from the deposition apparatus described in connection with FIG. 5. For example, the deposition apparatus further includes a first dummy substrate DS1 disposed on the first buffer surface BS1. In this regard, the first dummy substrate DS1, unlike the substrate 2 that is detachable from the electrostatic chuck 432a, is fixed on the electrostatic chuck 432a, in some cases permanently. The material for forming the first dummy substrate DS1 may be the same as or similar to that of the substrate 2.

As described above in connection with FIG. 5, the vibration of the patterning slit sheet 130 may be minimized by allowing the surface 432a' of the electrostatic chuck 432a to have the first buffer surface BS1 in addition to the substrate mounting surface SS. Vibration may be further minimized by making the magnetic force applying unit 432b to correspond to at least the substrate mounting surface SS and the first buffer surface BS1, when the substrate 2 passes above the patterning slit sheet 130.

Before the substrate 2 passes above the patterning slit sheet 130, when the first buffer surface BS1 passes above the patterning slit sheet 130, due to the presence of first dummy substrate DS1 on the first buffer surface BS1, a magnetic force applied to the patterning slit sheet 130 may affect the patterning slit sheet 130 through the electrostatic chuck 432a and first dummy substrate DS1. As a result, when the substrate 2 passes above the patterning slit sheet 130, a magnetic force with an intensity that is identical or similar to that of the magnetic force applied to patterning slit sheet 130 through the electrostatic chuck 432a and the substrate 2 may be applied to the patterning slit sheet 130 when the first buffer surface BS1 passes above the patterning slit sheet 130 before the substrate 2 passes above the patterning slit sheet 130.

As described above, by controlling the state and/or environment of the patterning slit sheet 130 at the time the first buffer surface BS1 passes above the patterning slit sheet 130 to be identical or similar to the state and/or environment of the patterning slit sheet 130 at the time the substrate 2 passes above the patterning slit sheet 130, the deposition may be accurately performed on the substrate 2.

Figure 8:
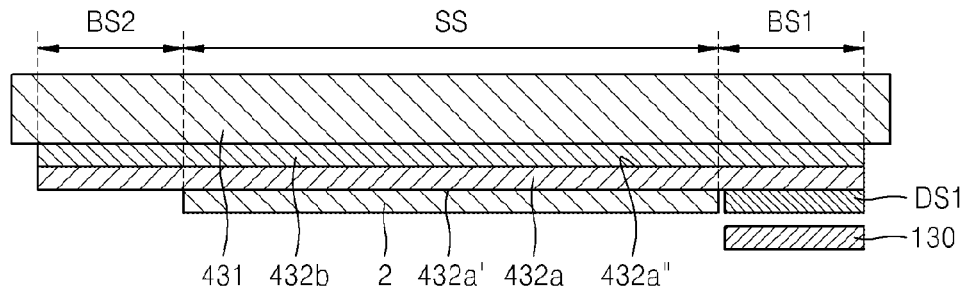
FIG. 8 is a side cross-sectional view schematically illustrating a portion of a deposition assembly in a moving unit and a deposition unit of a deposition apparatus according to another embodiment of the present invention.
Figure 8:
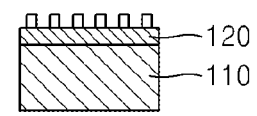

Also, in addition to the structure in which the first dummy substrate DS1 is disposed on the first buffer surface BS1, as illustrated in FIG. 8 which is a side cross-sectional view schematically illustrating a portion of a deposition assembly in the moving unit 430 and the deposition unit 100 of a deposition apparatus according to another embodiment of the present invention, the electrostatic chuck 432a may have a second buffer surface BS2.

Figure 9:
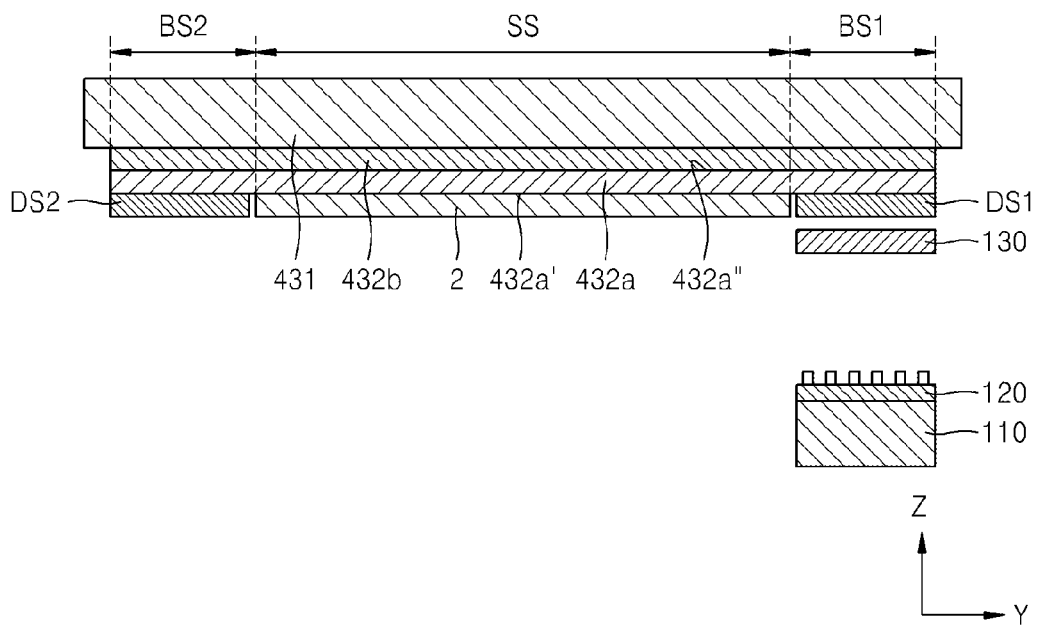
FIG. 9 is a side cross-sectional view schematically illustrating a portion of a deposition assembly in a moving unit and a deposition unit of a deposition apparatus according to another embodiment of the present invention.

FIG. 9 is a side cross-sectional view schematically illustrating a portion of a deposition assembly in the moving unit 430 and the deposition unit 100 of a deposition apparatus according to another embodiment of the inventive concept. As illustrated in FIG. 9, the second dummy substrate DS2 may be disposed on the second buffer surface BS2 by controlling the state and/or environment of the patterning slit sheet 130 at the time the second buffer surface BS2 passes above the patterning slit sheet 130 to be identical or similar to the state and/or environment of the patterning slit sheet 130 at the time the substrate 2 passes above the patterning slit sheet 130. This way, the deposition may be accurately performed on the substrate 2. The second dummy substrate DS2, unlike the substrate 2 that is detachable from the electrostatic chuck 432a, may be permanently fixed on the electrostatic chuck 432a. The first dummy substrate DS1 may be forme of the same or similar material as the substrate 2.

Figure 10:
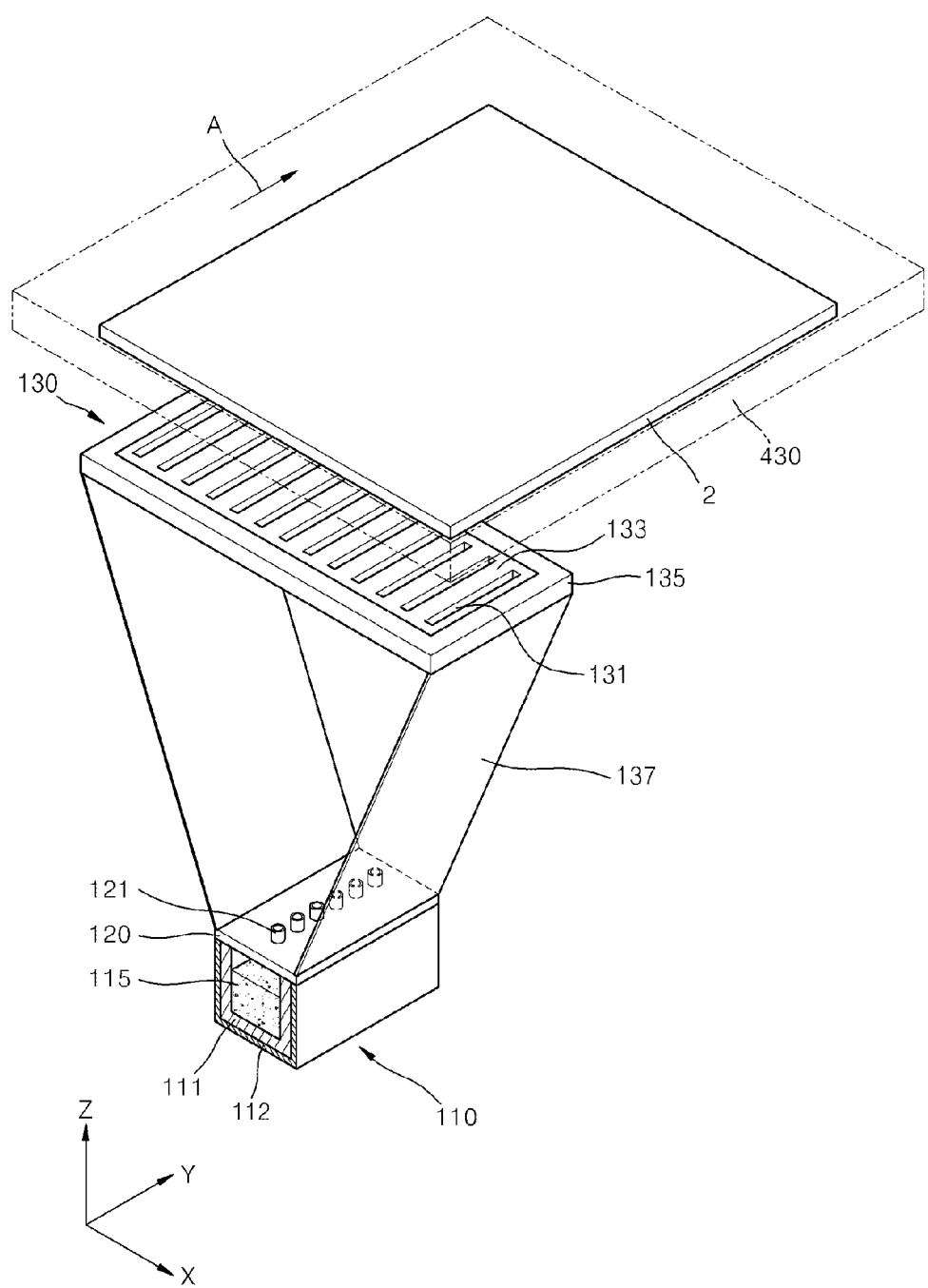
FIG. 10 is a perspective view schematically illustrating a portion of a deposition assembly of a deposition apparatus according to another embodiment of the present invention.

FIG. 10 is a perspective view schematically illustrating a portion of a deposition assembly of a deposition apparatus according to another embodiment of the present inventive concept.

The patterning slit sheet 130 may have the shape illustrated in FIG. 10. As illustrated in FIG. 10, the patterning slit sheet 130 may include a frame 135 and a sheet 133 attached thereto by, for example, welding. The sheet 133 may have a plurality of patterning slits 131 aligned in, for example, the X-axis direction. The deposition material located inside the crucible 111 of the deposition source 110 may be evaporated by a heater 112 and be emitted via the deposition source nozzle 121 of the deposition source nozzle unit 120. The deposition material reaches the substrate 2 through the patterning slit 131 of the patterning slit sheet 130. In this regard, the deposition source 110 and/or the deposition source nozzle unit 120 may be coupled to the patterning slit sheet 130, for example by using a connection member 137.

Also, in manufacturing an organic light-emitting display apparatus, when an intermediate layer including an emission layer is formed, an integrally formed common layer may be formed on the entire display region, or a pattern layer may be formed on a predetermined region of the display region. When the common layer is formed on the substrate 2, the patterning slit sheet 130 may have one large opening instead of a plurality of patterning slits 131. In addition, if an integrally formed layer is formed on the substrate 2, the bending of the patterning slit sheet 130 may not be a serious problem.

Even when a pattern layer is formed on the substrate 2, as illustrated in FIG. 10, due to a plurality of the deposition source nozzles 121 of the deposition source nozzle unit 120 of the deposition assembly which are aligned in the first direction (+Y direction), on a plane (ZX plane) perpendicular to the first direction (+Y direction), one deposition source nozzle 121 may be disposed along a second direction (for example, the X-axis direction) that is perpendicular to the first direction (+Y direction) and is parallel to the substrate 2 fixed on the moving unit 430. Accordingly, when a pattern layer is formed, occurrence of a shadow may be substantially reduced.

While the above description focuses on a deposition apparatus, embodiments of the present inventive concept are not limited thereto. For example, a method of manufacturing an organic light-emitting display apparatus by using the deposition apparatus is also within the scope of the present inventive concept.

According to a method of manufacturing an organic light-emitting display apparatus according to an embodiment of the present invention, the moving unit 430 is conveyed to the chamber 101 by using the first conveying unit 410 provided such that the moving unit 430, on which the substrate 2 is fixed, passes through the chamber 101. Thereafter, when the deposition assembly 100-1 disposed inside the chamber 101 is spaced apart from the substrate 2 while the substrate 2 is moved with respect to the deposition assembly 100-1 by using the first conveying unit 410, the deposition material emitted from the deposition assembly 100-1 is deposited on the substrate 2 to form a layer. Then, the moving unit 430 separated from the substrate 2 is returned by using the second conveying unit 420 that passes through the chamber 101. By doing so, the moving unit 430 may continue to move in alternating directions by using the first conveying unit 410 and the second conveying unit 420.

Regarding the method of manufacturing an organic light-emitting display apparatus described above, the deposition assembly may be one of the deposition assemblies of the deposition apparatuses according to the previous embodiments. In the forming of a layer, when the moving unit 430 with the substrate is disposed above the patterning slit sheet 130 of the deposition assembly 100-1, the magnetic force applying unit 432b disposed on the other surface 432a" corresponding to the side 432a' of the electrostatic chuck 432a of the moving unit 430 applies a magnetic force-induced attractive force to the patterning slit sheet 130 to prevent the patterning slit sheet 130 from bending away from (−Z direction) the first conveying unit 410.

Also, in the forming of a layer, for example, as illustrated in FIG. 5, the substrate 2 may be moved relatively to the deposition assembly 100-1 by using the first conveying unit 410 in such a way that the first buffer surface BS1 of the surface 432a' of the electrostatic chuck 432a approaches the patterning slit sheet 130 before the substrate mounting surface SS approaches the patterning slit sheet 130. By doing so, when the substrate 2 passes above the patterning slit sheet 130, the vibration of the patterning slit sheet 130 may be minimized. By doing so, when the substrate 2 passes above the patterning slit sheet 130, the vibration of the patterning slit sheet 130 may be minimized. In this regard, the area of the first buffer surface BS1 may be greater than the area of the margin surface MS, and may be about the same as the area of the patterning slit sheet 130.

Furthermore, in the forming of a layer, for example, as illustrated in FIG. 6, immediately after the substrate mounting surface SS of the surface 432a' of the electrostatic chuck 432a leaves the space above the patterning slit sheet 130, the second buffer surface BS2 of the surface 432a' of the electrostatic chuck 432a may pass above the patterning slit sheet 130. This way, by the time the substrate 2 leaves the space above the patterning slit sheet 130, the vibration of the patterning slit sheet 130 may be minimized. In this regard, the area of the second buffer surface BS2 may correspond to the area of the patterning slit sheet 130.

Also, as illustrated in FIG. 7, the moving unit 430 may further include a first dummy substrate BS1 disposed on the first buffer surface BS1 of the electrostatic chuck 432a, and in the forming of the layer, when the first buffer surface BS1 is disposed above the patterning slit sheet 130 of the deposition assembly 100-1, the magnetic force applying unit 432b disposed on the other surface 432a" corresponding to the surface 432a' of the electrostatic chuck 432a of the moving unit 430 may apply a magnetic force to the patterning slit sheet 130 through the first dummy substrate DS1. By doing so, the environment of the patterning slit sheet 130 when the first buffer surface BS1 passes above the patterning slit sheet 130 may be controlled to be identical or similar to the environment of the patterning slit sheet 130 when the substrate mounting surface SS passes above the patterning slit sheet 130. Furthermore, as illustrated in FIG. 8, the first dummy substrate DS1 may be disposed on the first buffer surface BS1 and a second buffer surface BS2 may exist, and as illustrated in FIG. 9, even the second dummy substrate DS2 may exist on the second buffer surface BS2.

Figure 11:
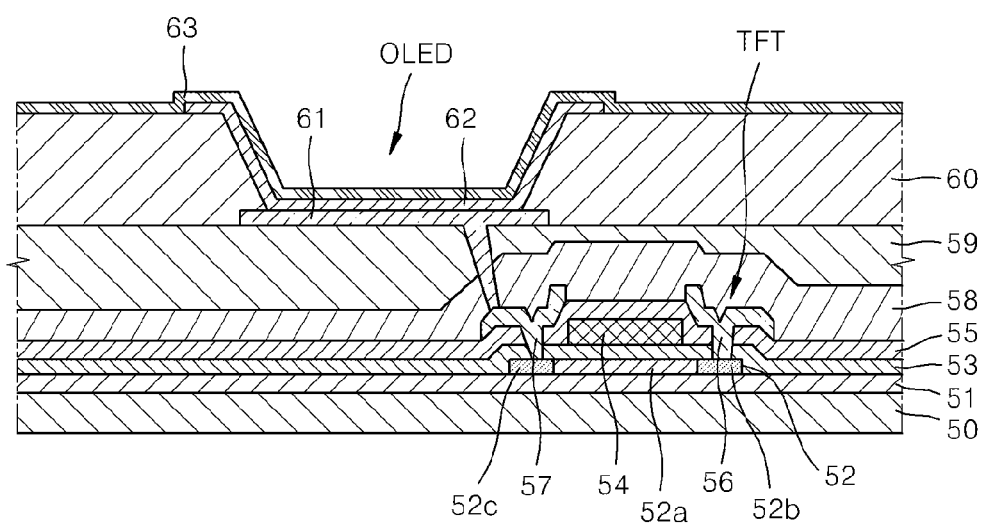
FIG. 11 is a schematic cross-sectional view of an organic light-emitting display apparatus manufactured by using the deposition apparatus of FIG. 1.

FIG. 11 is a schematic cross-sectional view of an organic light-emitting display apparatus according to another embodiment of the present inventive concept manufactured by using the deposition apparatus of FIG. 1.

Referring to FIG. 11, various elements of an organic light-emitting display apparatus are formed on a substrate 50. The substrate 50 may be substantially similar to the substrate 2 illustrated in FIG. 3, or a cut portion of the substrate 2. The substrate 50 may be formed of a transparent material, for example, glass, plastic, or metal.

A common layer, such as a buffer layer 51, a gate insulating layer 53, or an interlayer insulating layer 55, may be formed on the entire surface of the substrate 50, and a patterned semiconductor layer 52 including a channel region 52a, a source contact region 52b, and a drain contact region 52c may be formed, and a gate electrode 54, a source electrode 56, and a drain electrode 57, which constitute a thin film transistor TFT together with the patterned semiconductor layer 52, may be formed.

Also, a protection film 58 covering the thin film transistor TFT, and a planarization film 59 that has a top flat surface and is disposed on the protection film 58 may be formed on the entire surface of the substrate 50. An organic light-emitting device OLED including a patterned pixel electrode 61, an opposite electrode 63 roughly corresponding to the entire surface of the substrate 50, and a multi-layered intermediate layer 62 including an emission layer interposed between the pixel electrode 61 and the opposite electrode 63 are disposed on the planarization film 59. Unlike the illustrated intermediate layer 62, some layers of the intermediate layer 62 may be common layers covering the substrate 50, and other layers of the intermediate layer 62 may be patterned layers corresponding to the pixel electrode 61. The pixel electrode 61 may be electrically connected to the thin film transistor TFT. In some embodiments, the pixel defining film 60 covering an edge of the pixel electrode 61 and having openings defining pixel regions may be formed on the planarization film 59 to roughly correspond to the entire surface of the substrate 50.

In the case of the organic light-emitting display apparatus, at least some of the constituents thereof may be formed by using the deposition apparatuses according to the previous embodiments and the methods of manufacturing an organic light-emitting display apparatus according to the previous embodiments.

For example, the intermediate layer 62 may be formed by using the deposition apparatuses according to the previous embodiments and the methods of manufacturing an organic light-emitting display apparatus according to the previous embodiments. For example, a hole injection layer (HIL), a hole transport layer (HTL), an emission layer (EML), an electron transport layer (ETL), and electron injection layer (EIL), which may constitute the intermediate layer 62, may be formed by using the deposition apparatuses according to the previous embodiments and the methods of manufacturing an organic light-emitting display apparatus according to the previous embodiments.

Layers of the intermediate layer 62 may be formed in a state in which a deposition assembly including a deposition source, a deposition source nozzle unit 121, and a patterning slit sheet 133 may be disposed to be spaced apart from a target substrate. In such a case, when using a substrate that has any number of layers formed on it up to the pixel electrode 61 (see FIG. 11), deposition may be performed while any one of the deposition assembly and the substrate are moving relatively to each other.

When the patterning slit sheet includes, as illustrated in FIG. 10, a plurality of patterning slits 131 aligned in the X-axis direction, a layer of the intermediate layer 62 formed by using the patterning slit sheet may have a linear pattern. The layer may be, for example, an emission layer.

As described above, the deposition apparatus illustrated in FIG. 1 is suitable for accurate deposition on a predetermined region of a large-area substrate. The predetermined region may be substantially all of the substrate or less than all of the substrate. Accordingly, for example, even in an organic light-emitting display apparatus including a substrate with a size of 40 inch or more, the intermediate layer 62 may be accurately formed, leading to manufacturing of a high-quality organic light-emitting display apparatus.

Also, the moving unit 430, which is an element of the deposition apparatuses according to the previous embodiments, is within the scope of the present invention. That is, the moving unit 430 according to an embodiment of the present invention may include the electrostatic chuck 432a and the magnetic force applying unit 432b. The moving unit 430 is used in a deposition process, and may be a substrate moving unit on which the substrate 2 may be fixable. The moving unit 430 may have different embodiments. For example, as illustrated in FIGS. 5 to 9, the moving unit 430 may include the first buffer surface BS1 and/or the second buffer surface BS2, and the first dummy substrate DS1 and/or the second dummy substrate DS2.

According to an embodiment of the inventive concept, a substrate moving unit for deposition that allows a deposition material to be deposited on a target site on a substrate with improved accuracy, a deposition apparatus including the substrate moving unit, a method of manufacturing an organic light-emitting display apparatus, and an organic light-emitting display apparatus manufactured by using the method may be embodied. This, however, does not limit the scope of the inventive concept.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A method of manufacturing an organic light-emitting display apparatus, the method comprising:
    conveying a moving unit into a chamber by using a first conveying unit while a substrate is fixed on a first surface of an electrostatic chuck of the moving unit;
    forming a layer by depositing a deposition material ejected from a deposition assembly on the substrate while the substrate is spaced apart from the deposition assembly in the chamber and being moved with respect to the deposition assembly by the first conveying unit; and
    returning the moving unit separated from the substrate by using a second conveying unit,
    wherein the deposition assembly includes:
        a deposition source configured to hold a deposition material;
        a deposition source nozzle that is configured to eject the deposition material toward the first conveying unit from the deposition source; and
        a patterning slit sheet between the deposition source nozzle and the moving unit, the patterning slit sheet including a plurality of patterning slits, and
    wherein the forming of a layer comprises using a magnetic force applying unit to apply a magnetic force-induced attractive force to the patterning slit sheet to prevent the patterning slit sheet from bending away from the first conveying unit, wherein the magnetic force applying unit is disposed across the electrostatic chuck from the first surface.

2. The method of claim 1, wherein
the first surface of the electrostatic chuck has a substrate mounting surface on which the substrate is to be mounted and a first buffer surface located to a side of the substrate mounting surface, and the magnetic force applying unit covers at least the substrate mounting surface and the first buffer surface,
wherein the forming of a layer comprises transporting the substrate with respect to the deposition assembly by using the first conveying unit in such a way that the first buffer surface of the surface of the electrostatic chuck approaches the patterning slit sheet before the substrate mounting surface approaches the patterning slit sheet.

3. The method of claim 2, wherein
the first surface of the electrostatic chuck further has a margin surface located across the substrate mounting surface from the first buffer surface such that the substrate mounting surface approaches the patterning slit sheet before the margin surface approaches the patterning slit sheet while the moving unit, on which the substrate is fixed, approaches the patterning slit sheet of the deposition assembly by the first conveying unit.

4. The method of claim 2, wherein
the moving unit further includes a first dummy substrate disposed on the first buffer surface of the electrostatic chuck, and in the forming of the layer, when the first buffer surface is disposed above the patterning slit sheet of the deposition assembly, the magnetic force applying unit disposed on the other surface corresponding to the surface of the electrostatic chuck of the moving unit applies an attractive force due to a magnetic force to the patterning slit sheet through the first dummy substrate.

5. The method of claim 2, wherein
the first surface of the electrostatic chuck of the moving unit has a second buffer surface disposed across the substrate mounting surface from the first buffer surface, and the magnetic force applying unit covers at least the second buffer surface,
wherein in the forming of the layer, the substrate is moved with respect to the deposition assembly by using the first conveying unit such that the substrate mounting surface approaches the patterning slit sheet before the second buffer surface approaches the patterning slit sheet.

6. The method of claim 5, further comprising
a second dummy substrate disposed on the second buffer surface of the electrostatic chuck of the moving unit.

* * * * *